US010720354B2

(12) United States Patent
Bassom

(10) Patent No.: US 10,720,354 B2
(45) Date of Patent: Jul. 21, 2020

(54) SYSTEM AND METHOD FOR ALIGNING LIGHT-TRANSMITTING BIREFRINGENT WORKPIECES

(71) Applicant: Axcelis Technologies, Inc., Beverly, MA (US)

(72) Inventor: Neil James Bassom, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 21 days.

(21) Appl. No.: 16/114,745

(22) Filed: Aug. 28, 2018

(65) Prior Publication Data

US 2020/0075379 A1 Mar. 5, 2020

(51) Int. Cl.
| | |
|---|---|
| *G01B 11/26* | (2006.01) |
| *G02B 5/30* | (2006.01) |
| *H01L 21/68* | (2006.01) |
| *H01L 21/66* | (2006.01) |

(52) U.S. Cl.
CPC .............. *H01L 21/68* (2013.01); *G01B 11/26* (2013.01); *G02B 5/3025* (2013.01); *H01L 22/10* (2013.01)

(58) Field of Classification Search
CPC ....... G01B 11/272; G01B 11/27; G01B 11/26; G02B 5/3025; H01L 21/67259; H01L 21/68; H01L 22/10
See application file for complete search history.

(56) References Cited

U.S. PATENT DOCUMENTS

| | | | |
|---|---|---|---|
| 5,740,034 A | 4/1998 | Saeki | |
| 6,162,008 A * | 12/2000 | Perkins | ................... G01B 11/24 198/394 |
| 6,677,602 B1 * | 1/2004 | Norton | ................... H01L 21/681 250/559.29 |
| 7,453,160 B2 * | 11/2008 | Ray | ................... H01L 21/67259 257/797 |

(Continued)

FOREIGN PATENT DOCUMENTS

WO 2009133848 A1 11/2009

OTHER PUBLICATIONS

International Search Report and Written Opinion dated Nov. 26, 2019 in connection with International Application No. PCT/US2019/047837.

*Primary Examiner* — Violeta A Prieto
(74) *Attorney, Agent, or Firm* — Eschweiler & Potashnik, LLC

(57) ABSTRACT

A workpiece alignment system has a light emission apparatus to direct a beam of light toward a first side of a workpiece through a first polarizer apparatus. A light receiver apparatus positioned on a second side of the workpiece receives the beam of light through a second polarizer apparatus between the workpiece and the light receiver apparatus. A workpiece support supports the workpiece. A rotation device selectively supports and rotates the workpiece support about a support axis. A controller determines a position of the workpiece based on an amount of the beam of light received by the light receiver apparatus. The controller determines a position of the workpiece when the workpiece is supported and rotated based, at least in part, on a rotational position of the workpiece support and at least a portion of the beam of light received by the light receiver apparatus.

20 Claims, 6 Drawing Sheets

(56) References Cited

U.S. PATENT DOCUMENTS

| | | |
|---|---|---|
| 9,255,894 B2 | 2/2016 | Vanhoomissen |
| 2003/0053046 A1* | 3/2003 | Ise .................... G01N 21/9501 |
| | | 356/237.2 |
| 2004/0056216 A1* | 3/2004 | Inenaga ................ G03F 9/7011 |
| | | 250/548 |
| 2011/0043821 A1* | 2/2011 | Stewart ............. G01B 11/0641 |
| | | 356/504 |
| 2014/0111797 A1* | 4/2014 | Kitamura ............. G01B 11/272 |
| | | 356/138 |
| 2014/0152976 A1* | 6/2014 | VanHoomissen ........................... |
| | | G01N 21/9505 |
| | | 356/51 |
| 2016/0063790 A1* | 3/2016 | Stewart ................... G07D 7/20 |
| | | 356/365 |
| 2017/0299374 A1* | 10/2017 | Stewart ............. G01B 11/0675 |
| 2018/0094921 A1* | 4/2018 | Baggett ................ H01L 21/681 |
| 2019/0120617 A1* | 4/2019 | Baggett ................. G01B 11/27 |

* cited by examiner

SYSTEM AND METHOD FOR ALIGNING LIGHT-TRANSMITTING BIREFRINGENT WORKPIECES

FIELD

The present disclosure relates generally to workpiece processing systems and methods for processing workpieces, and more specifically to a system and method for handling and aligning workpieces having various light transmission properties.

BACKGROUND

In semiconductor processing, many operations may be performed on a single workpiece or semiconductor wafer. In many processing operations, a particular orientation of the workpiece and/or knowledge of the position of the workpiece with respect to a workpiece holder is needed in order to properly process or handle the workpiece. For example, operations such as an exchange of workpieces between transport carriers or storage cassettes and the processing system and a transfer of the workpieces from an atmospheric environment into an evacuated environment of a process chamber of the processing system through one or more load lock chambers may require specific orientation(s) or knowledge of the spatial position of the workpiece for proper workpiece handling and processing.

An orientation of the workpiece (e.g., notch alignment) may be performed within the evacuated environment or atmospheric environment via a light presence sensor, whereby a beam of light is emitted by a light emitter and directed toward the workpiece concurrent to a rotation of the workpiece with respect to the beam of light. A variation in light received by a light receiver can be then used to determine the position of a notch defined in the workpiece and/or an eccentricity of a position of the workpiece, depending on how the light is fully or partially received. One such system is disclosed in U.S. Pat. No. 5,740,034 to Hiroaki Saeki, whereby a waveform associated with the received light signals is utilized to determine the position of the notch and/or eccentric position of the workpiece.

SUMMARY

The present disclosure advantageously overcomes the limitations of the prior art by providing a system, apparatus, and method for accurately determining the positions of workpieces having various transmissivities, thereby improving accuracy and minimizing costs of ownership associated with the systems. More particularly, the present disclosure provides a system and method for advantageously determining a position of a birefringent workpiece utilizing various polarizing filters. The present disclosure thus provides a positioning solution for practically any substrate material and thickness, regardless of various coatings or properties of the substrate.

Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

In accordance with one exemplary aspect of the disclosure, a workpiece alignment system is provided, wherein the workpiece alignment system comprises a light emission apparatus configured to direct a beam of light at one or more wavelengths along a path toward a first side of a workpiece plane associated with a workpiece. The path, for example, is associated with a peripheral region of the workpiece, and the workpiece, for example, comprises a birefringent workpiece or an optically opaque workpiece and may comprise one or more layers formed thereon. A first polarizer apparatus, for example, is disposed between the light emission apparatus and the workpiece plane.

A light receiver apparatus, for example, is positioned along the first path and is configured to receive the beam of light on a second side of the workpiece plane, wherein the second side is opposite the first side. A second polarizer apparatus, for example, is disposed between the workpiece plane and the light receiver apparatus. In one example, a workpiece support is configured to selectively support the workpiece along the workpiece plane, and a rotation device is operably coupled to the workpiece support and configured to selectively rotate the workpiece support about a support axis.

A controller is further provided, and in one example, the controller is configured to determine a position of the workpiece based on an amount of the beam of light that is received through the workpiece by the light receiver apparatus when the workpiece intersects the path. The controller, for example, is further configured to determine a position of the workpiece with respect to the support axis when the workpiece is supported and rotated via the workpiece support, wherein the determination of the position of the workpiece is based, at least in part, on a rotational position of the workpiece support, and at least a portion of the beam of light received by the light receiver apparatus associated with the rotational position of the workpiece support.

In one example, the first polarizer apparatus comprises a first circular polarizer filter, and the second polarizer apparatus comprises a second circular polarizer filter. The first circular polarizer filter, for example, comprises a first linear polarizer filter and a first quarter wave plate, wherein the first linear polarizer filter is positioned at +45 degrees to the first quarter wave plate, and wherein the first linear polarizer filter is positioned closer to the light emission apparatus than the first quarter wave plate. The second circular polarizer filter, for example, comprises a second linear polarizer filter and a second quarter wave plate, wherein the second linear polarizer filter is positioned at +45 degrees to the second quarter wave plate, and wherein the second linear polarizer filter is positioned closer to the light receiver apparatus than the second quarter wave plate.

In another example, the second circular polarizer comprises a compensator. The compensator, for example, comprises a second linear polarizer filter and a second quarter wave plate, wherein the second linear polarizer filter is positioned at +45 degrees to the second quarter wave plate, and wherein the second linear polarizer filter is positioned closer to the light receiver apparatus than the second quarter wave plate. The second linear polarizer filter, for example, is further configured to provide a variable phase change between orthogonal electric field components based on an input to the compensator, such as from a voltage input from the controller. The workpiece, in one example, comprises a birefringent workpiece, wherein the controller is further configured to selectively control the voltage input to the compensator, thereby controlling the phase change of the second linear polarizer filter.

In one example, the light emission apparatus comprises a laser configured to transmit the beam of light at the one or more wavelengths. In another example, the light emission apparatus comprises a white light source and one or more filters to transmit the beam of light at the one or more wavelengths. In another example, the light emission apparatus is configured to transmit the beam of light at the one or more wavelengths across a predetermined range of wavelengths.

In accordance with another exemplary aspect, the position of the workpiece that is determined by the workpiece alignment system comprises a two-dimensional offset of a center of the workpiece from the support axis along the workpiece plane. The position of the workpiece, for example, may further comprise a rotational position of the workpiece about the support axis. The rotational position of the workpiece about the support axis, for example, is associated with an edge feature of the workpiece, wherein the controller is further configured to determine the position of the workpiece with respect to the support axis based on the edge feature of the workpiece.

The controller, for example, is configured to determine a waveform defined by the at least a portion of the beam of light that is received by the light receiver at a plurality of rotational positions of the workpiece support, wherein the controller is further configured to determine the position of the workpiece with respect to the support axis based on the waveform.

According to another exemplary aspect, a method for aligning a workpiece is provided, wherein a workpiece is placed on a workpiece support having a support axis. A beam of light is directed at one or more wavelengths toward a first side of the workpiece along first path, wherein the beam of light passes through a first polarizer apparatus disposed between the light emission apparatus and the workpiece. A light receiver apparatus is positioned along the first path and configured to selectively receive the beam of light on a second side of the workpiece plane based on a position of the workpiece. The second side is opposite the first side, wherein the second beam of light passes through a second polarizer apparatus disposed between the workpiece plane and the light receiver apparatus. In one example, the second polarizer apparatus comprises a compensator, and wherein the method further comprises controlling a voltage input to the compensator, thereby controlling a phase of the beam of light. A position of the workpiece with respect to the workpiece support is further determined based on an amount of the beam of light that is received through the workpiece by the light receiver apparatus when the workpiece intersects the path.

In one example, the workpiece support is further rotated about the support axis, and a position of the workpiece with respect to the support axis is determined when the workpiece is supported and rotated via the workpiece support. The determination of the position of the workpiece, for example, is based, at least in part, on a rotational position of the workpiece support, and at least a portion of the beam of light received by the light receiver apparatus associated with the rotational position of the workpiece support.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
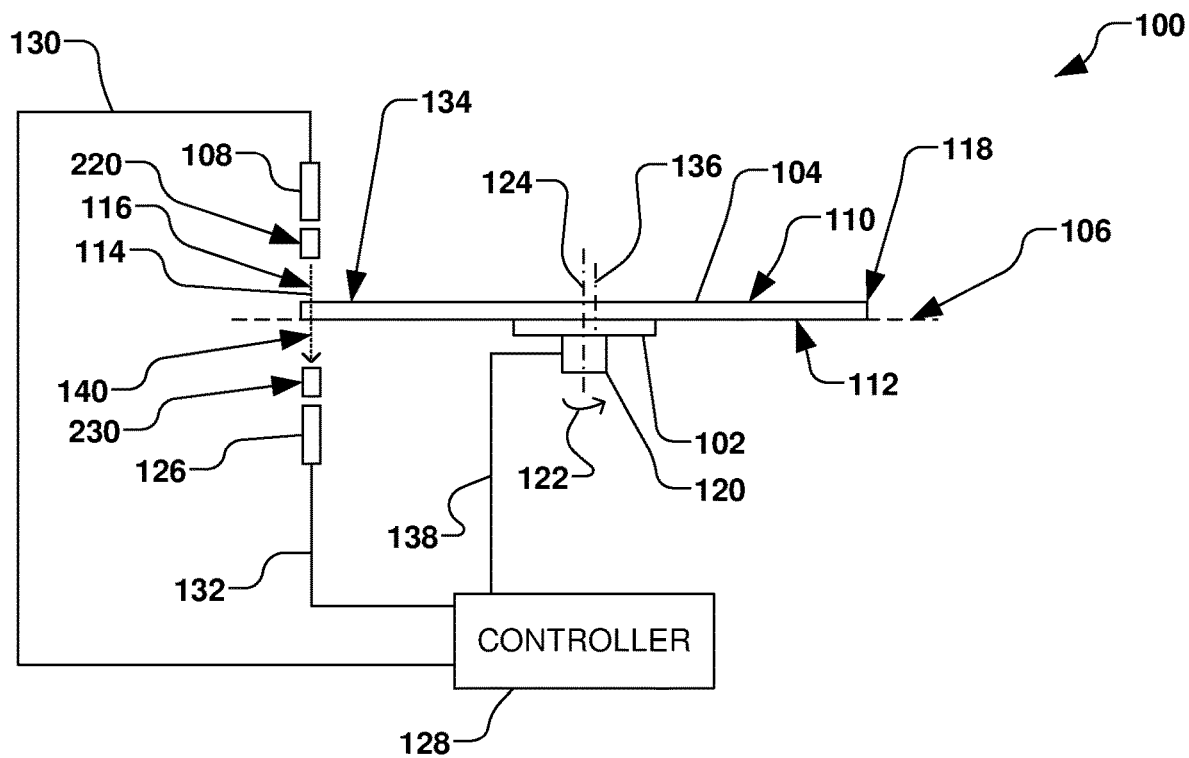
FIG. 1 illustrates a block diagram of an exemplary workpiece alignment system in accordance with an aspect of the present disclosure.

Conventional systems have been developed for detecting optically opaque silicon workpieces, whereby blockage of a passage of light at optical wavelengths between a light source and a sensor is utilized to determine a position of the silicon workpieces. However, some workpieces, such as silicon carbide (SiC) workpieces, are optically transparent or near-transparent. As such, light at optical wavelengths may pass through the silicon carbide workpiece, thus making the silicon carbide workpiece appear transparent or near-transparent in conventional alignment systems. Thus, a low signal-to-noise ratio may be experienced when attempting align or determine a position such silicon carbide workpieces, and the conventional alignment systems can encounter various problems in identifying an edge or other feature(s) of the silicon carbide workpiece.

Additionally, workpieces can undergo processing that can result in films or other features being formed on the workpieces. As such, a formerly optically-transparent workpiece may be densely covered with films, metal lines, etc. after processing, whereby the formerly optically-transparent workpiece may no longer substantially transmit light. The present disclosure thus advantageously provides a solution for detection of workpieces that is suitable for detecting workpieces having either optically transparent or optically opaque qualities.

The present disclosure advantageously appreciates that workpieces comprised of particular materials, such as silicon carbide, are birefringent, meaning that the material has a refractive index that depends on the polarization and propagation direction of light. In simple terms, light entering a birefringent workpiece at a first polarization exits the birefringent workpiece at a second polarization that is different from the first polarization. The present disclosure utilizes the birefringence of such workpieces to produce a contrast between the workpiece and vacuum or air when the workpiece is imaged using polarized light. The present disclosure provides various examples for yielding a contrast between the workpiece and background, such as making the workpiece appear bright against a dark background, or dark against a bright background. In the latter case, the techniques and apparatus of the present disclosure is insensitive to the processing state of the workpiece. Further, the present disclosure may be utilized to align or determine positions of both birefringent workpieces and opaque workpieces, alike. Accordingly, the present disclosure may be advantageously compatible with the architecture(s) or control schemes of existing semiconductor processing systems.

The present disclosure is thus directed generally toward a workpiece handling system for semiconductor processes, and more particularly, to a method and an alignment apparatus configured to characterize and/or align workpieces having varying light transmission properties.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In general, an aligner comprises a light emitter and a light receiver, whereby the light emitter directs a beam of light toward an edge of a workpiece, where the aligner further determines an amount of the emitted light that is blocked from reaching the light receiver as the workpiece is rotated about a rotation axis. For example, if a center of the workpiece is offset from the rotation axis of the aligner, variations will be present in the amount of light received by the light receiver as the workpiece blocks varying amounts of the emitted light as the workpiece is rotated. The amount of blocked light, for example, is represented as a percentage of the total light that is emitted. The amount and variation of light received is subsequently converted to a dimension associated with the workpiece (e.g., an offset), whereby, in one example, the dimension is utilized by an end-effector to retrieve the workpiece at the center of the workpiece.

Referring now to the figures, FIG. 1 illustrates an exemplary workpiece alignment system 100 in accordance with one or more aspects of the present disclosure. The workpiece alignment system 100, for example, comprises a workpiece support 102 configured to selectively support a workpiece 104 along a workpiece plane 106. The workpiece support 102, for example, may comprise any number of support mechanisms, such as pins, plates, or other mechanisms (not shown) operable to selectively support the workpiece 104.

In accordance with one exemplary aspect, a light emission apparatus 108 is positioned on one of a first side 110 and a second side 112 of the workpiece plane 106, wherein the light emission apparatus is configured to direct a beam of light 114 along a path 116. The path 116, for example, is associated with a peripheral region 118 of the workpiece 104.

A rotation device 120 is further operably coupled to the workpiece support 102, wherein the rotation device is configured to selectively rotate (e.g., illustrated by arrow 122) the workpiece support about a support axis 124. The support axis 124, for example, is perpendicular to the workpiece plane 106.

In one particular example, the emission apparatus 108 (e.g., also called a light emission apparatus) is configured to emit one or more wavelengths of light. The one or more wavelengths of light emitted by the emission apparatus 108, for example, may be determined based on the constituency of the workpiece 104. A receiver apparatus 126 (e.g., also called a light receiver apparatus) is further provided and configured to receive the beam of light 114 concurrent with the rotation of the workpiece support 102 about the support axis 124. The light receiver apparatus 126 is positioned on one of the first side 110 and second side 112 of the workpiece plane 106 that is generally opposite the light emission apparatus 108.

In accordance with several aspects of the present disclosure, the workpiece alignment system 100 further comprises a controller 128, wherein the controller is configured to determine one or more of a position and orientation of the workpiece 104 with respect to the workpiece support 102 based on an initial transmission 130 (e.g., transmitted amount) of the beam of light 114 and a received signal 132 associated with the beam of light and that is received (e.g., passing by and/or through the workpiece) by the light receiver apparatus 126. For example, the received signal 132 of the beam of light 114 is based, at least in part on one or more of a material constituency of the workpiece 104, one or more layers (not shown) formed on the workpiece, one or more devices (not shown) formed on the workpiece, and one or more operations previously performed on the workpiece, such as a previous ion implantation or other semiconductor process previously performed on the workpiece.

According to another example, the controller 128 is further configured to determine a position 134 of the workpiece 104 with respect to the support axis 124. It should be noted that the controller 128, for example, may comprise multiple individual controllers (not shown) associated with various components of the processing system, or may be a single controller for the whole system, and all such controllers are contemplated as falling within the scope of the present disclosure.

Figure 2:
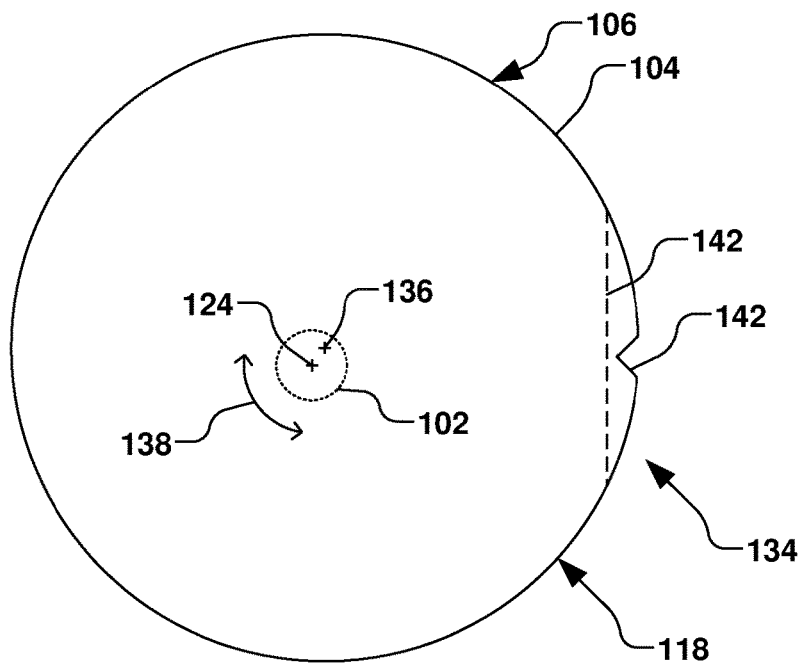
FIG. 2 is a plan view of an exemplary workpiece on a workpiece support of an exemplary alignment mechanism.

The position 134 of the workpiece 104, for example, may be determined by the controller 128, whereby the controller is configured to determine a center 136 of the workpiece 104 with respect to the support axis 124 of the workpiece support 102, as illustrated in FIG. 2. For example, as illustrated in FIG. 1, the determination of the position 134 of the workpiece 104 with respect to the support axis 124 is based, at least in part, on a rotational position 138 of the workpiece support 102, and the received signal 132 indicative of a portion 140 of the beam of light 114 that is received by the light receiver apparatus 126.

The portion 140 of the beam of light 114 that is received by the light receiver apparatus 126, for example, is associated with the rotational position 138 of the workpiece support 102. In one example, the position 134 of the workpiece 104 that is determined by the controller 128 comprises a two-dimensional offset of the center 136 of the workpiece from the support axis 124 along the workpiece plane 106, as illustrated in FIG. 2. The position 134 of the workpiece 104 may further comprise the rotational position 138 of the workpiece 104 or workpiece support 102 about the support axis 124, wherein the rotational position of the workpiece about the support axis is associated with an edge feature 142 of the workpiece, and wherein the controller 128 of FIG. 1 is further configured to determine the position of the workpiece with respect to the support axis based on the edge feature of the workpiece. The edge feature 142 of FIG. 2, for example, may comprise a notch, flat, or other feature associated with a periphery 118 of the workpiece 104.

Figure 3:
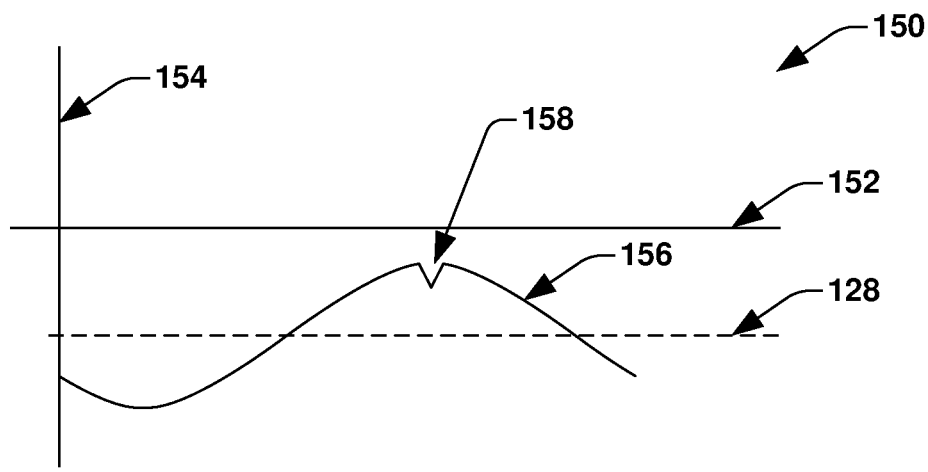
FIG. 3 is a plot of a sensed position of a workpiece versus a rotational position of the workpiece support according to another exemplary aspect of the disclosure.

FIG. 3, for example, illustrates a plot 150 of a rotational position 152 (e.g., provided by a servo motor or other apparatus associated with the rotation device 120 of FIG. 1) versus the output 154 from the light receiver apparatus 126 of FIG. 1, wherein the center 136 of the workpiece 104 can be extrapolated from an output signal curve 156 (from the received signal 132) indicating the passage of the edge feature 142 through the beam of light 114 (e.g., illustrated in FIG. 3 at position 158) and a knowledge of the dimensions of the edge feature.

Figure 4:
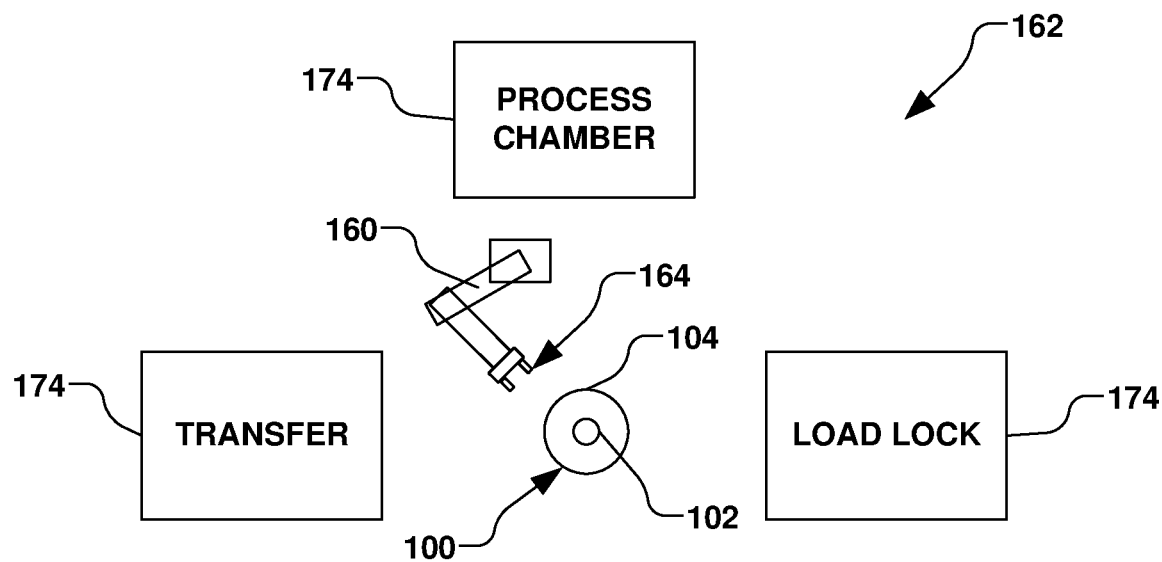
FIG. 4 illustrates the exemplary workpiece handling system incorporating the workpiece alignment system of FIG. 1.

Accordingly, the controller 128 of FIG. 1 can determine an offset vector value associated with the center 136 of the workpiece 104 which can be provided to a robot 160 illustrated in the workpiece handling system 162 of FIG. 4. The robot 160, for example, may be configured to pick the workpiece 104 from the workpiece support 102 based on the offset vector value, whereby the workpiece is generally centered with respect to a support member 164 when it is picked from workpiece alignment system 100 of FIG. 1. The rotational position of the workpiece 104 can be further utilized to rotationally align the workpiece with respect to the workpiece alignment system 100 prior to being picked by the robot 160 and transferred to one or more stations 166, such as a process chamber, load lock chamber, transfer system, or other apparatus utilized in processing of the workpiece.

Figure 5A:
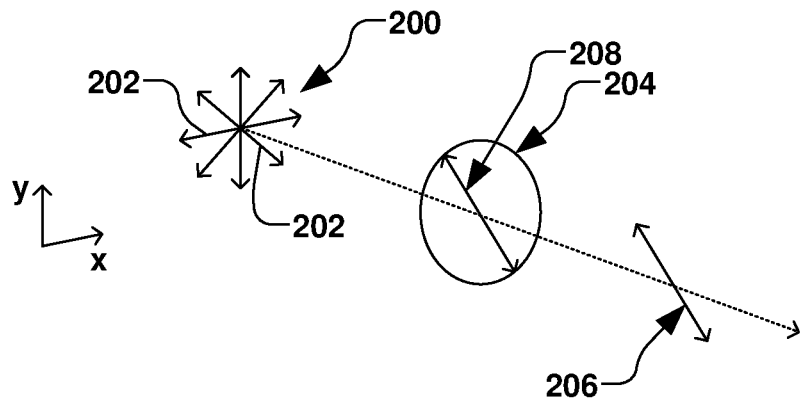
FIGS. 5A-5C illustrate perspective schematic views of exemplary polarizations in accordance with various aspects of the present disclosure.

In order to gain a better understanding of the present disclosure, FIG. 5A illustrates an idealized example of unpolarized light 200 having electric fields 202 extending in all directions. When the unpolarized light 200 is passed through a linear polarizer 204, however, only polarized light 206 with electric fields oriented along a selected axis 208 of the linear polarizer is passed. As illustrated, the polarized light 206 is not oriented along the x-axis or y-axis; rather, the polarized light is oriented at the selected axis 208 such that the polarized light has components along both the x-axis and y-axis, whereby those components differing phases for $E_x$ and $E_y$ oscillations of the light wave. As such, the electric vector of the light wave increases or decreases along that selected axis 208.

Figure 5B:
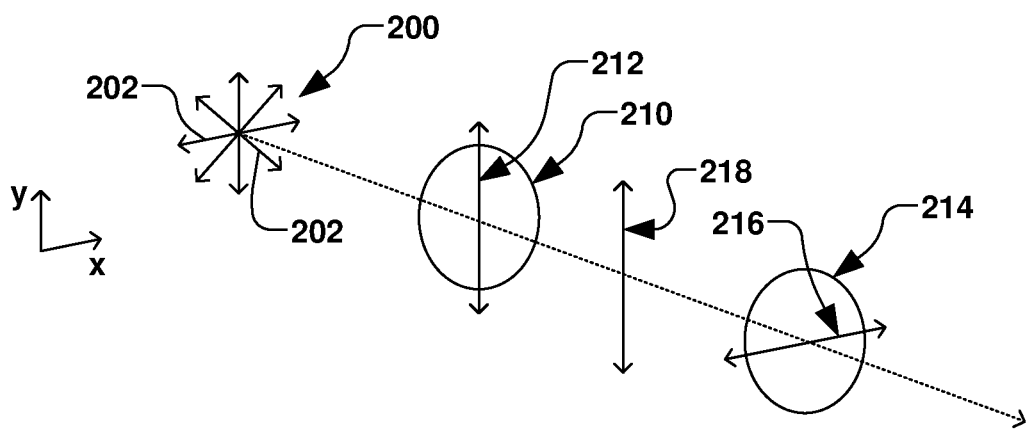

FIG. 5B illustrates an idealized example where the unpolarized light 200 is passed through a first linear polarizer 210 having a first polarization axis 212 oriented along the y-axis and a second linear polarizer 214 having a second polarization axis 216 oriented along the x-axis. Thus, the unpolarized light 200 enters the first linear polarizer 210 having the electric fields 202 in all directions and first polarized light 218 exits the first linear polarizer having electric fields only along the y-axis. When the first polarized light 218 enters the second linear polarizer 214, since the second polarization axis 216 is oriented 90 degrees from the first polarization axis 212, the second linear polarizer will reject all light that is not along its axis, meaning that all the first polarized light is filtered and no light is passed.

Figure 5C:
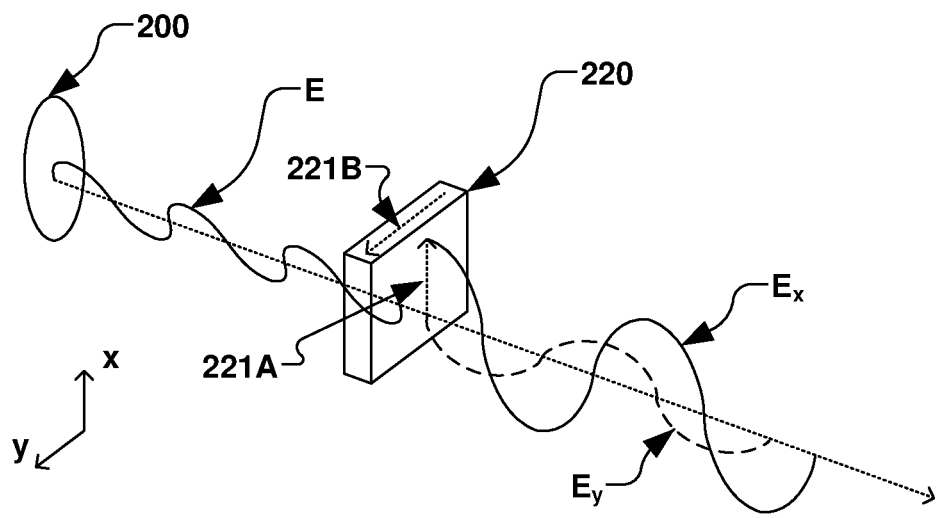

FIG. 5C illustrates an idealized circular polarization for utilization with a birefringent material in accordance with various aspects of the disclosure. A birefringent material, for example, has different optical constants along different axes, whereby unpolarized light entering the birefringent material is retarded by differing amounts along the x-axis and y-axis (respectively referred to as the "slow axis" 221A and "fast axis" 221B), thus changing the relative phase of the respective electrical field components $E_x$ and $E_y$. If the thickness of the material is selected to provide a relative phase shift of 90° (called a "quarter-wave plate"), then linearly polarized light incident at 45° to the fast and slow axes will emerge as circularly polarized.

An electric field that is out of phase, for example, can have electric field components that are 90° separated. As such, when the electric field $E_x$ along the x-axis is at its maximum and the electric field $E_y$ along the y-axis is zero, the electric field $E_y$ along the y-axis increases while the electric field $E_x$ along the x-axis decreases. Accordingly, while still comprised of both x components and y components, a circle is defined at the maximum of the electric field vector, since the x components and y components are 90° phases from each other, and the electric vector turns in a circle.

In general, a birefringent material has an index of refraction that is dependent on the orientation that it is being viewed. As such, a first index of refraction is present in a first axis (e.g., the fast axis), and a second index of refraction is present in a second axis (e.g., the slow axis) of the material. The index of refraction of a particular material refers to the ratio of the velocity of light in a vacuum relative to its velocity in that material, whereby the ratio determines the extent to which light is refracted when entering or leaving the material. Silicon carbide (SiC) is such a birefringent material, having a refractive index of −2.67, and where a 0.046 difference exists between fast and slow axes.

As shown in FIG. 5C, the electric field E from the unpolarized light 200 is passed through a circular polarizing filter 220 (e.g., a linear polarizer followed by a quarter-wave plate whose slow and fast axes are at 45° to the axis of the linear polarizer) where the respective electrical field components $E_x$ and $E_y$ are in phase, and whereby the x component has its maximum value the same as the y component. As such, the net electric field vector describes an ellipse. Accordingly, circularly-polarized light entering SiC will generally emerge as elliptically polarized.

If linearly polarized light having two electric fields $E_x$, $E_y$ that are initially in-phase with one another is passed through a birefringent material, the electric fields along the fast and slow axes become generally out of phase. Accordingly, linearly polarized light having zero phase difference, when passed through the birefringent material, will generally exhibit some phase difference upon emergence from the birefringent material. If the phase difference is 90°, then circularly polarized light will emerge. If the phase difference is 0°, then linearly polarized light will emerge. However, when the phase difference is not an integer multiple of 90°, as is generally the case with birefringent materials, elliptically polarized light will emerge, where the electric field generally describes an ellipse.

Figure 6A:
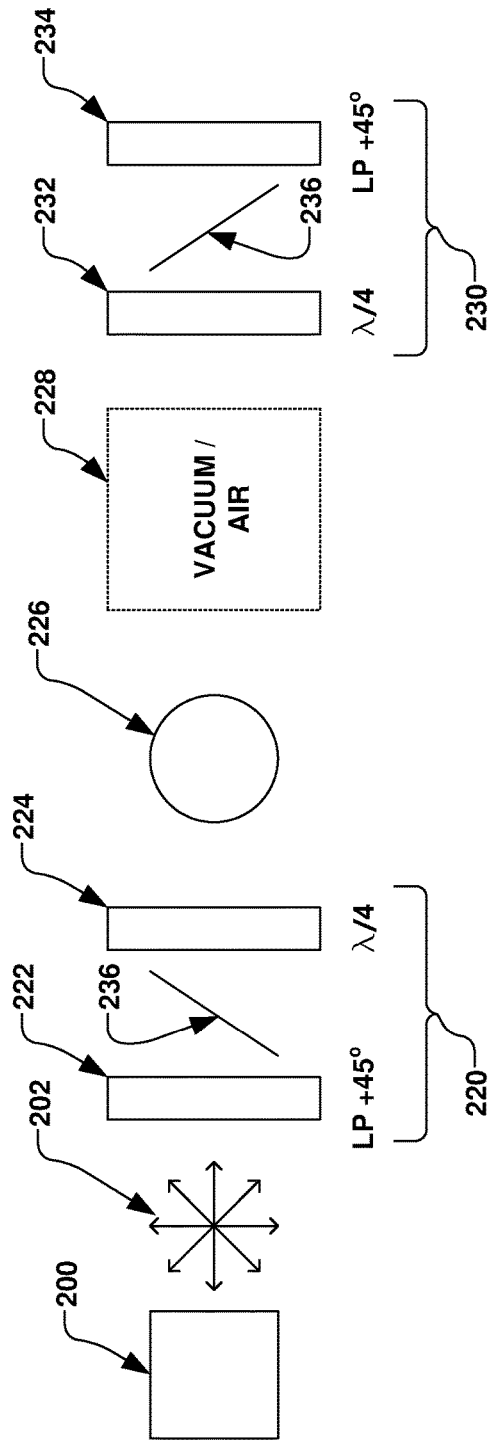
FIG. 6A illustrates a schematic side view of an exemplary light beam passing through a first polarizing filter and second polarizing filter in accordance with an aspect of the present disclosure.

FIG. 6A illustrates a schematic example of the light source 200 emitting light having electric fields 202 extending in all directions, whereby a circular polarizing filter 220 comprising a first linear polarizing filter 222 (e.g., slow and fast axes are at +45° to the axis of the polarizer) in front of a first quarter-wave plate 224 to emit circularly polarized light 226. When passed through vacuum or air 228, the circularly polarized light 226 then passes through a second circular polarizer 230 comprising a second quarter-wave plate 232 positioned in front of a second linear polarizing filter 234 (e.g., slow and fast axes are at +45° to the axis of the polarizer) that is twisted opposite the first linear polarizing filter 222. When being transmitted generally unchanged through vacuum or air 228 (e.g., no other material lies between the first and second circular polarizers 220, 230), the first linear polarizing filter 222 yields linearly polarized light 236, while no transmission of light is generally emitted from the second linear polarizing filter 234. For example, when transmitting the light through the vacuum or air 228, the first and second quarter-wave plates 224, 232 rotate linearly polarized light 236 orthogonally with respect to the first linearly polarized light 236, thus providing a 180° phase shift between $E_x$ and $E_y$ of FIG. 5C.

Figure 6B:
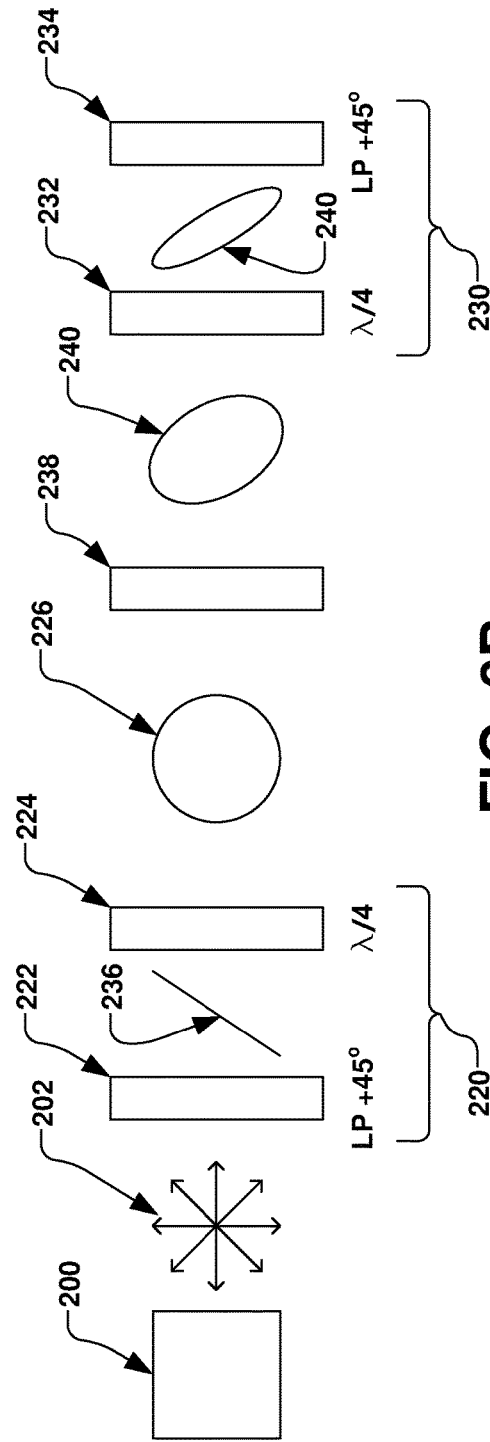
FIG. 6B illustrates a schematic side view of the exemplary light beam of FIG. 6A further passing through a workpiece in accordance with an aspect of the present disclosure.

However, as illustrated in FIG. 6B, when a birefringent workpiece 238 (e.g., a workpiece comprising or comprised of SiC) is positioned between the first circular polarizer 220 and second circular polarizer 230, the circularly polarized light 226 the circularly polarized light is changed to become elliptically polarized light 240 before the second circular polarizer 230, whereby a light component along the axis of the second linear polarizer 234 is further transmitted past the second circular polarizer.

If the birefringent workpiece 238 (e.g., the workpiece 104 of FIG. 1) comprises an edge that is transparent, for example, the scheme utilizing the first circular polarizer 220 and second circular polarizer 230 provided in FIGS. 6A-6B can be implemented in the system 100 of FIG. 1, whereby the controller 128 to is configured to discern transitions between dark and light signals in the received signal 132 of the beam of light 114 by the light receiver apparatus 126, whereby light signals would indicate a presence of the workpiece 104 and dark signals (or absence of light signals) would indicate an absence of the workpiece.

Figure 7A:
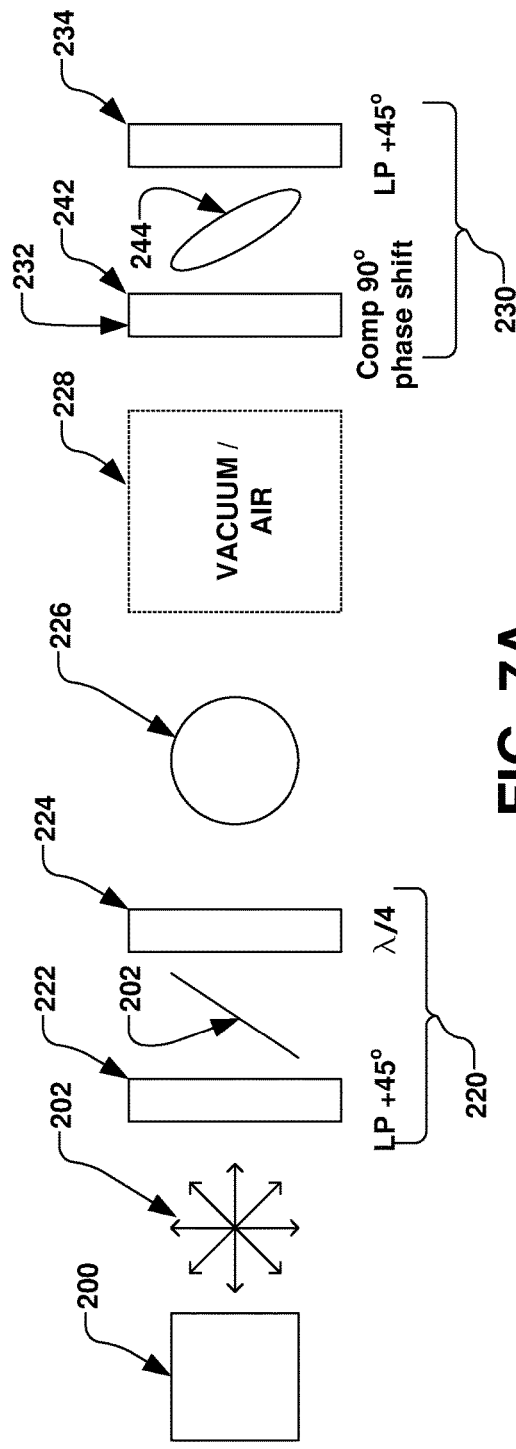
FIG. 7A illustrates a schematic side view of an exemplary light beam passing through a first polarizing filter and second polarizing filter comprising a compensator in accordance with an aspect of the present disclosure.
Figure 7B:
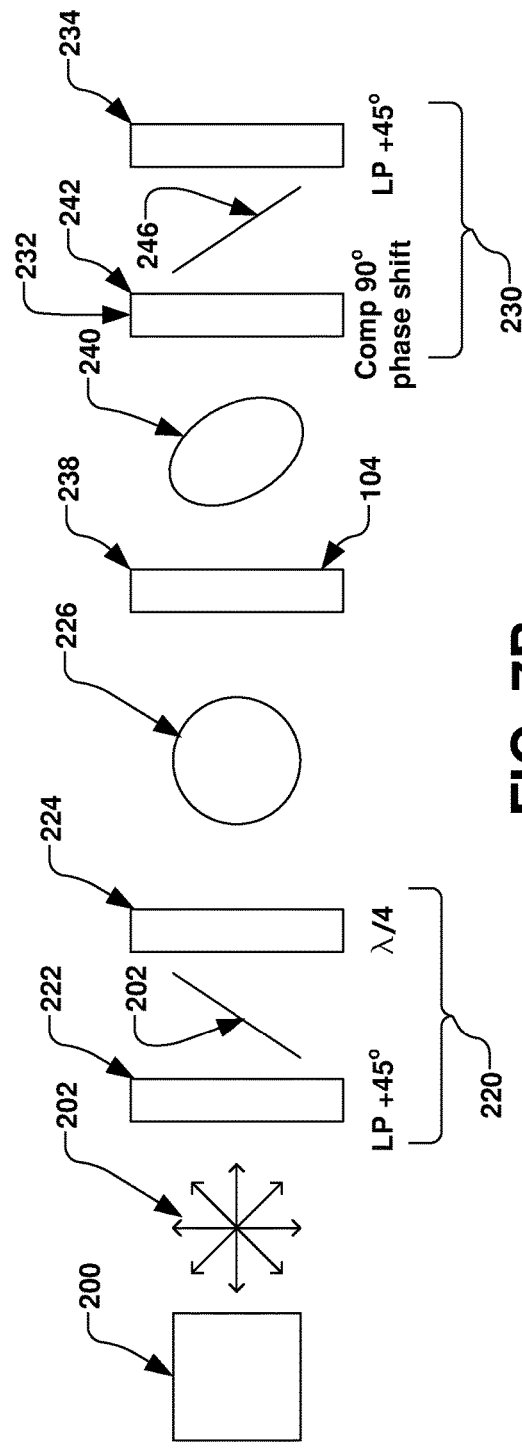
FIG. 7B illustrates a schematic side view of the exemplary light beam of FIG. 7A further passing through a workpiece in accordance with an aspect of the present disclosure.

However, if the birefringent workpiece 238 does not have a transparent boundary edge, or if the workpiece 104 of FIG. 1 is opaque and/or not birefringent, FIGS. 7A-7B illustrate another example for sensing at least a portion of the workpiece. For example, when films and/or metallization layers (not shown) are formed on the workpiece 104, whether the workpiece is birefringent or opaque, the present disclosure further provides the scheme shown in FIGS. 7A-7B whereby light signals would indicate the absence of the workpiece 104 and dark signals (or absence of light signals) would indicate the presence of the workpiece. In one such example, the second circular polarizing filter 230 of FIGS. 7A-7B comprises a compensator 242 (e.g., a rotatable linear polarizer) configured to allow a variable phase change between $E_x$ and $E_y$ electric field components of FIG. 5C along with the second linear polarizer 234.

For example, in FIG. 7A, when the light is transmitted through vacuum or air 228 (e.g., an absence of the workpiece 104 of FIG. 1), the compensator 242 yields elliptically polarized light 244 having $E_x$ and $E_y$ electric field components of FIG. 5C, whereby the second quarter wave plate 234 yields some transmission of light therethrough. As such, the light receiver apparatus 126 of FIG. 1 would receive the transmission of light through the vacuum or air 228 and send the signal 132 to the controller 128, accordingly. Further, the compensator 242 may be controlled (e.g., via a rotation of the linear polarizer) to provide the maximum signal 132 to the controller 128 when no workpiece 104 is present, as illustrated in FIG. 7A.

Further, in accordance with another example, the compensator 242 may be controlled to correct for phase changes through the birefringent workpiece 238, thus producing elliptically polarized light 244 in the vacuum or air 228 of FIG. 7A, while producing linearly polarized light 246 when the light is passed through the birefringent workpiece 238 in FIG. 7B. The compensator 242, for example, may be controlled by rotating the linear polarizer 232 such that the light is linearly polarized prior to encountering the quarter wave plate 234, whereby the quarter wave plate nullifies or zeros out the majority or all of the light passing through the birefringent workpiece 238. The compensator 242, for example, introduces a controllable variation in phase as a function of a voltage applied to compensator.

As such, the signal 132 to the controller 128 of FIG. 1 would relate the workpiece 104 as being dark, while the vacuum or air 228 is related as being brighter than the workpiece. In one example, the controller 128 is configured to selectively control a voltage input to the compensator 242, whereby the phase change of the second linear polarizer filter 234 is controlled to maximize a ratio of a maximum signal to a minimum signal associated with the at least a portion of the beam of light 114 received by the light receiver apparatus 126.

Further, in accordance with another exemplary aspect, the present disclosure shown in FIGS. 7A-7B may be utilized with any workpiece 104, regardless of whether the workpiece is birefringent (e.g., SiC) or opaque (e.g., Si). For example, each workpiece 104 that is to be detected may be characterized, whereby the compensator 242 may be appropriately tuned to provide the light and dark signals 132 discussed above. For example, when the material composition and/or thickness of the workpiece 104 is varied and/or when the difference between the slow axis 221A and fast axis 221B of FIG. 5C is not known, the phase change that will be induced is similarly unknown. However, since some phase change is known to occur, the present disclosure converts the circularly polarized light 226 of FIG. 7B into elliptically polarized light 240 when the light is passed through the birefringent workpiece 238. The elliptically polarized light 240 then passes through the quarter wave plate of the compensator 242, which rotates the phase of the y-axis to be 180° out of phase, whereby the slow axis 221A and the fast axis 221B have another phase change added thereto, thus yielding elliptically polarized light 244 of FIG. 7A.

In accordance with yet another exemplary aspect, a situation may arise when the change in phase accomplished by the compensator 242 may be an exact multiple of 360° when utilizing a single wavelength of light emitted from the emission apparatus 108 of FIG. 1 (e.g., monochromatic light). In such a situation, the birefringent workpiece 238 of FIG. 7B may provide the same result as the vacuum or air 228 of FIG. 7A, whereby discernment between the birefringent workpiece and the vacuum or air become difficult. In such an instance, the emission apparatus 108 of FIG. 1 may be configured to emit a plurality of wavelengths of light, whereby difficulties associated with the birefringent workpiece 238 introducing a 360° degree phase difference are ameliorated by utilizing multiple wavelengths. The plurality of wavelengths of light emitted by the emission apparatus 108 may be implemented via a filter (not shown) over a white light source.

Figure 8:
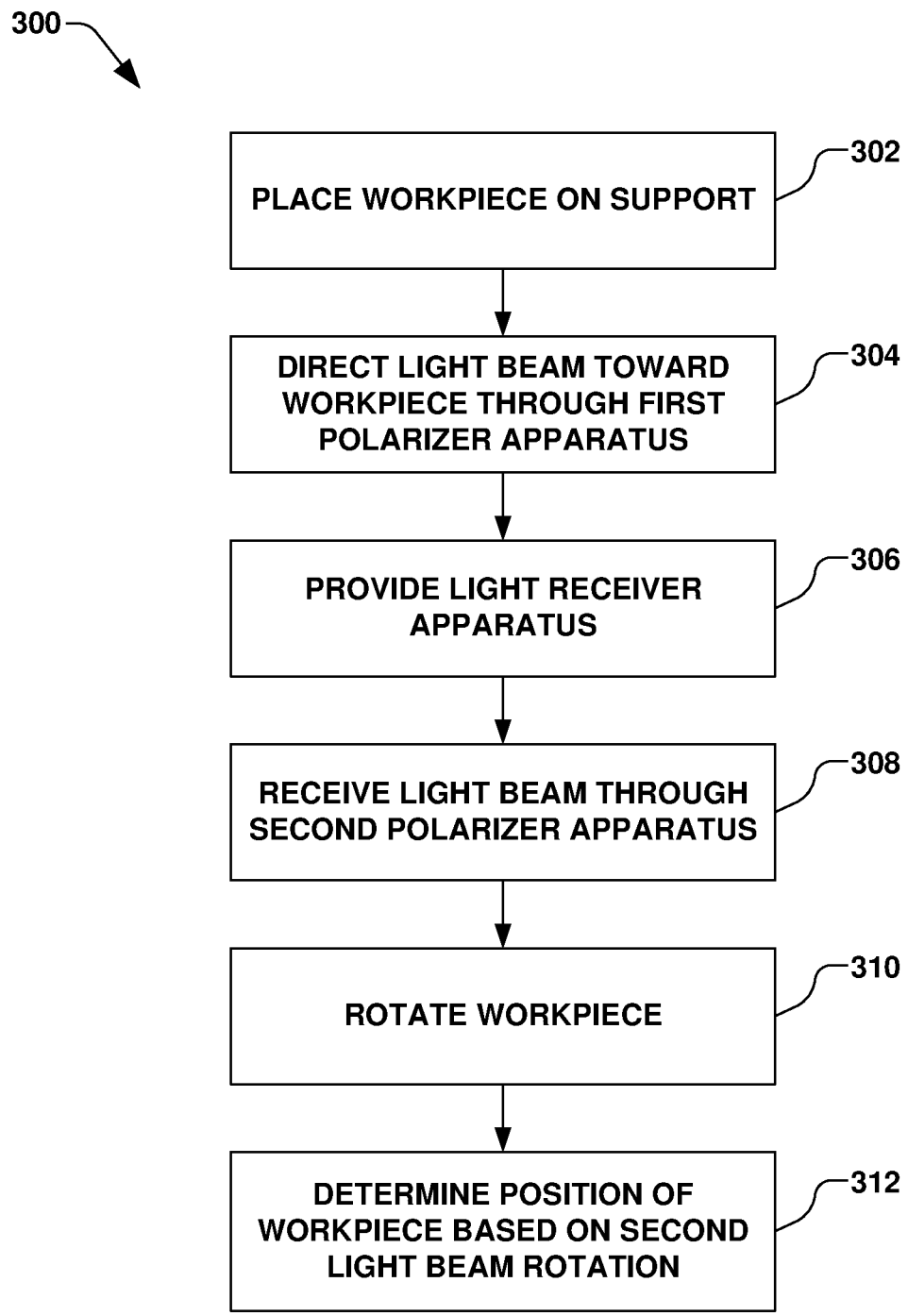
FIG. 8 is a block diagram illustrating an exemplary method for aligning workpieces according to another exemplary aspect of the disclosure.

In accordance with another exemplary aspect, a method 300 is provided for aligning a workpiece in FIG. 8. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 8, the method 300 begins at act 302, wherein a workpiece is placed on a workpiece support having a support axis. In act 304, a beam of light is directed toward a first side of the workpiece at one or more wavelengths along a first path. The beam of light, for example, passes through a first polarizer apparatus disposed between the light emission apparatus and the workpiece.

In act 306, a light receiver apparatus is provided and positioned along the first path and configured to selectively receive the beam of light on a second side of the workpiece plane. In act 308, the beam of light is received by the light receiver apparatus through a second polarizer apparatus disposed between the workpiece plane and the light receiver apparatus. In act 310, the workpiece is rotated, and in act 312, a position of the workpiece with respect to the workpiece support is determined based on an amount of the beam of light that is received through the workpiece by the light receiver apparatus when the workpiece intersects the path.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece alignment system, comprising:
   a light emission apparatus configured to direct a beam of light at one or more wavelengths along a path toward a first side of a workpiece plane associated with a workpiece, and wherein the path is associated with a peripheral region of the workpiece;
   a first polarizer apparatus disposed between the light emission apparatus and the workpiece plane;
   a light receiver apparatus positioned along the first path and configured to receive the beam of light on a second side of the workpiece plane, wherein the second side is opposite the first side;
   a second polarizer apparatus disposed between the workpiece plane and the light receiver apparatus;
   a workpiece support configured to selectively support the workpiece along the workpiece plane;
   a rotation device operably coupled to the workpiece support and configured to selectively rotate the workpiece support about a support axis; and
   a controller configured to determine a position of the workpiece based on an amount of the beam of light that is received through the workpiece by the light receiver apparatus when the workpiece intersects the path, wherein the controller is further configured to determine a position of the workpiece with respect to the support axis when the workpiece is supported and rotated via the workpiece support, wherein the determination of the position of the workpiece is based, at least in part, on a rotational position of the workpiece support, and at least a portion of the beam of light received by the light receiver apparatus associated with the rotational position of the workpiece support.

2. The workpiece alignment system of claim 1, wherein the first polarizer apparatus comprises a first circular polarizer filter, and wherein the second polarizer apparatus comprises a second circular polarizer filter.

3. The workpiece alignment system of claim 2, wherein the first circular polarizer filter comprises a first linear polarizer filter and a first quarter wave plate, wherein the first linear polarizer filter is positioned at +45 degrees to the first quarter wave plate, and wherein the first linear polarizer filter is positioned closer to the light emission apparatus than the first quarter wave plate.

4. The workpiece alignment system of claim 3, wherein the second circular polarizer filter comprises a second linear polarizer filter and a second quarter wave plate, wherein the second linear polarizer filter is positioned at +45 degrees to the second quarter wave plate, and wherein the second linear polarizer filter is positioned closer to the light receiver apparatus than the second quarter wave plate.

5. The workpiece alignment system of claim 3, wherein the second circular polarizer filter comprises a compensator.

6. The workpiece alignment system of claim 5, wherein the compensator comprises a second linear polarizer filter and a second quarter wave plate, wherein the second linear polarizer filter is positioned at +45 degrees to the second quarter wave plate, and wherein the second linear polarizer filter is positioned closer to the light receiver apparatus than the second quarter wave plate, and wherein the second linear polarizer filter is configured to provide a variable phase change between orthogonal electric field components based on an input to the compensator.

7. The workpiece alignment system of claim 2, wherein the second circular polarizer filter comprises a compensator, and wherein the controller is further configured to provide a variable phase change between orthogonal electric field components based on an input to the compensator.

8. The workpiece alignment system of claim 7, wherein the workpiece comprises a birefringent workpiece, and wherein the controller is further configured to selectively control a voltage input to the compensator, thereby controlling the phase change of the second linear polarizer filter.

9. The workpiece alignment system of claim 5, wherein the controller is configured to selectively control the voltage input to the compensator, whereby the phase change of the second linear polarizer filter is controlled to maximize a ratio of a maximum signal to a minimum signal associated with the at least a portion of the beam of light received by the light receiver apparatus.

10. The workpiece alignment system of claim 1, wherein the light emission apparatus is a laser configured to transmit the beam of light at the one or more wavelengths.

11. The workpiece alignment system of claim 1, wherein the light emission apparatus is configured to transmit the beam of light at the one or more wavelengths across a predetermined width.

12. The workpiece alignment system of claim 1, wherein the position of the workpiece comprises a two-dimensional offset of a center of the workpiece from the support axis along the workpiece plane.

13. The workpiece alignment system of claim 12, wherein the position of the workpiece further comprises a rotational position of the workpiece about the support axis.

14. The workpiece alignment system of claim 13, wherein the rotational position of the workpiece about the support axis is associated with an edge feature of the workpiece, and wherein the controller is further configured to determine the position of the workpiece with respect to the support axis based on the edge feature of the workpiece.

15. The workpiece alignment system of claim 1, wherein the controller is configured to determine a waveform, wherein the waveform is defined by the at least a portion of the beam of light received by the light receiver at a plurality of rotational positions of the workpiece support, and wherein the controller is further configured to determine the position of the workpiece with respect to the support axis based on the waveform.

16. The workpiece alignment system of claim 1, wherein the workpiece comprises one of silicon carbide or silicon.

17. The workpiece alignment system of claim 16, wherein the workpiece comprises one or more layers formed thereon.

18. A method for aligning a workpiece, the method comprising:
placing a workpiece on a workpiece support having a support axis;
directing a beam of light at a one or more wavelengths toward a first side of the workpiece along first path, wherein the beam of light passes through a first polarizer apparatus disposed between the light emission apparatus and the workpiece;
providing a light receiver apparatus positioned along the first path and configured to selectively receive the beam of light on a second side of the workpiece plane based on a position of the workpiece, wherein the second side is opposite the first side, and wherein the second beam of light passes through a second polarizer apparatus disposed between the workpiece plane and the light receiver apparatus; and
determining a position of the workpiece with respect to the workpiece support based on an amount of the beam of light that is received through the workpiece by the light receiver apparatus when the workpiece intersects the path.

19. The method of claim 18, further comprising:
rotating the workpiece support about the support axis; and
determining a position of the workpiece with respect to the support axis when the workpiece is supported and rotated via the workpiece support, wherein the determination of the position of the workpiece is based, at least in part, on a rotational position of the workpiece support, and at least a portion of the beam of light received by the light receiver apparatus associated with the rotational position of the workpiece support.

20. The method of claim 18, wherein the second polarizer apparatus comprises a compensator, and wherein the method further comprises controlling a voltage input to the compensator, thereby controlling a phase of the beam of light.

* * * * *